(12) United States Patent
Philipp et al.

(10) Patent No.: US 7,876,606 B2
(45) Date of Patent: Jan. 25, 2011

(54) INTEGRATED CIRCUIT FOR PROGRAMMING A MEMORY CELL

(75) Inventors: Jan Boris Philipp, Munich (DE); Thomas Happ, Dresden (DE)

(73) Assignee: Qimonda AG, Munich (DE)

( * ) Notice: Subject to any disclaimer, the term of this patent is extended or adjusted under 35 U.S.C. 154(b) by 414 days.

(21) Appl. No.: 12/166,755

(22) Filed: Jul. 2, 2008

(65) Prior Publication Data

US 2010/0002498 A1    Jan. 7, 2010

(51) Int. Cl.
  *G11C 11/00* (2006.01)
(52) U.S. Cl. .................. 365/163; 365/148
(58) Field of Classification Search .......... 365/163, 365/148, 201
  See application file for complete search history.

(56) References Cited

U.S. PATENT DOCUMENTS

| | | | |
|---|---|---|---|
| 7,085,154 B2 * | 8/2006 | Cho et al. ............. | 365/163 |
| 7,191,379 B2 * | 3/2007 | Adelmann et al. ...... | 714/758 |
| 7,606,111 B2 * | 10/2009 | Lee et al. ............. | 365/238.5 |
| 2006/0059405 A1 | 3/2006 | Parkinson | |

* cited by examiner

*Primary Examiner*—Anh Phung
(74) *Attorney, Agent, or Firm*—Dicke, Billig & Czaja, PLLC

(57) ABSTRACT

An integrated circuit includes an array of resistance changing memory cells. The array includes a first portion. The integrated circuit includes a circuit configured to apply a set pulse having a first pulse width to a first memory cell in the first portion to set the first memory cell. The first pulse width is based on a predetermined error percentage for the first portion.

24 Claims, 4 Drawing Sheets

INTEGRATED CIRCUIT FOR PROGRAMMING A MEMORY CELL

BACKGROUND

One type of memory is resistive memory. Resistive memory utilizes the resistance value of a memory element to store one or more bits of data. For example, a memory element programmed to have a high resistance value may represent a logic "1" data bit value and a memory element programmed to have a low resistance value may represent a logic "0" data bit value. Typically, the resistance value of the memory element is switched electrically by applying a voltage pulse or a current pulse to the memory element.

One type of resistive memory is phase change memory. Phase change memory uses a phase change material in the resistive memory element. The phase change material exhibits at least two different states. The states of the phase change material may be referred to as the amorphous state and the crystalline state, where the amorphous state involves a more disordered atomic structure and the crystalline state involves a more ordered lattice. The amorphous state usually exhibits higher resistivity than the crystalline state. Also, some phase change materials exhibit multiple crystalline states, e.g. a face-centered cubic (FCC) state and a hexagonal closest packing (HCP) state, which have different resistivities and may be used to store bits of data. In the following description, the amorphous state generally refers to the state having the higher resistivity and the crystalline state generally refers to the state having the lower resistivity.

Phase changes in the phase change materials may be induced reversibly. In this way, the memory may change from the amorphous state to the crystalline state—"set"—and from the crystalline state to the amorphous state—"reset"—in response to temperature changes. The temperature changes of the phase change material may be achieved by driving current through the phase change material itself or by driving current through a resistive heater adjacent the phase change material. With both of these methods, controllable heating of the phase change material causes controllable phase change within the phase change material.

A phase change memory including a memory array having a plurality of memory cells that are made of phase change material may be programmed to store data utilizing the memory states of the phase change material. One way to read and write data in such a phase change memory device is to control a current and/or a voltage pulse that is applied to the phase change material. The temperature in the phase change material in each memory cell generally corresponds to the applied level of current and/or voltage to achieve the heating.

To achieve higher density phase change memories, a phase change memory cell can store multiple bits of data. Multi-bit storage in a phase change memory cell can be achieved by programming the phase change material to have intermediate resistance values or states, where the multi-bit or multilevel phase change memory cell can be written to more than two states. If the phase change memory cell is programmed to one of three different resistance levels, 1.5 bits of data per cell can be stored. If the phase change memory cell is programmed to one of four different resistance levels, two bits of data per cell can be stored, and so on. To program a phase change memory cell to an intermediate resistance value, the amount of crystalline material coexisting with amorphous material and hence the cell resistance is controlled via a suitable write strategy.

The speed of a typical phase change memory is limited by the time used to set a memory cell to the crystalline state. To provide an error free memory, the time used to set a memory cell to the crystalline state is based on the slowest memory cell within the memory.

For these and other reasons, there is a need for the present invention.

SUMMARY

One embodiment provides an integrated circuit. The integrated circuit includes an array of resistance changing memory cells. The array includes a first portion. The integrated circuit includes a circuit configured to apply a set pulse having a first pulse width to a first memory cell in the first portion to set the first memory cell. The first pulse width is based on a predetermined error percentage for the first portion.

BRIEF DESCRIPTION OF THE DRAWINGS

The accompanying drawings are included to provide a further understanding of embodiments and are incorporated in and constitute a part of this specification. The drawings illustrate embodiments and together with the description serve to explain principles of embodiments. Other embodiments and many of the intended advantages of embodiments will be readily appreciated as they become better understood by reference to the following detailed description. The elements of the drawings are not necessarily to scale relative to each other. Like reference numerals designate corresponding similar parts.

DETAILED DESCRIPTION

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

It is to be understood that the features of the various exemplary embodiments described herein may be combined with each other, unless specifically noted otherwise.

Figure 1:
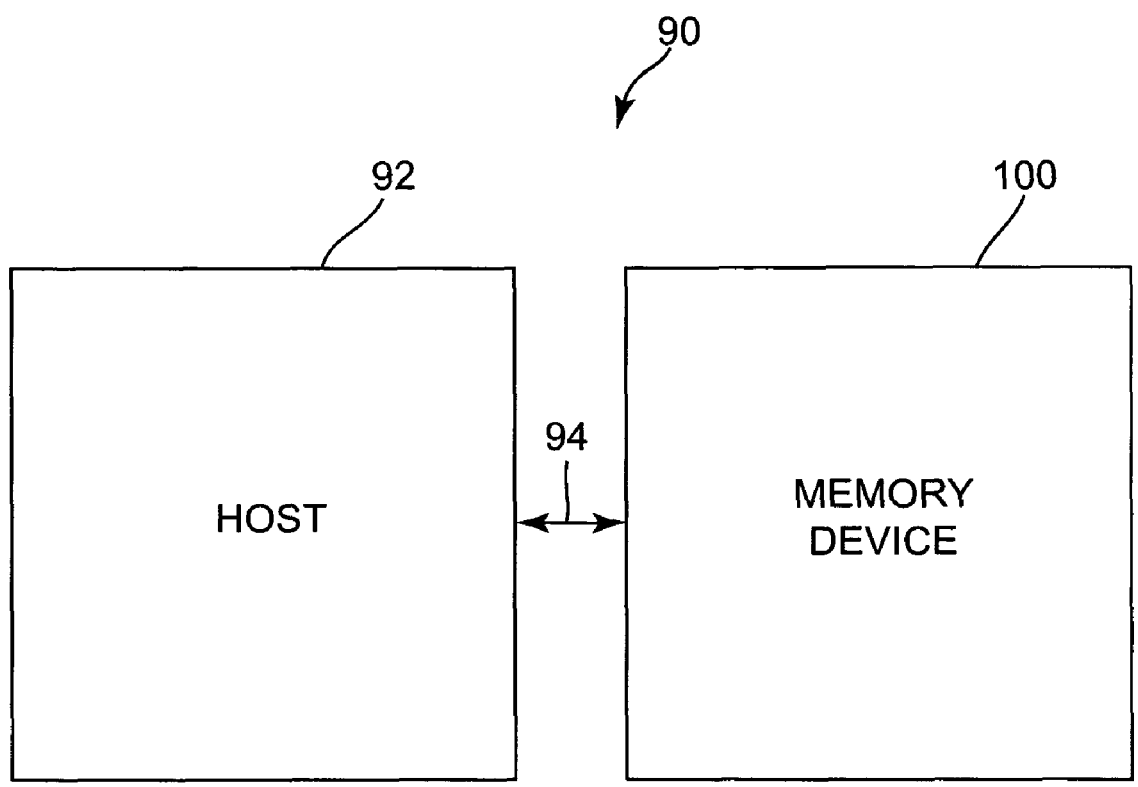
FIG. 1 is a block diagram illustrating one embodiment of a system.

FIG. 1 is a block diagram illustrating one embodiment of a system 90. System 90 includes a host 92 and a memory device 100. Host 92 is communicatively coupled to memory device 100 through communication link 94. Host 92 includes a computer (e.g., desktop, laptop, handheld), portable electronic device (e.g., cellular phone, personal digital assistant (PDA), MP3 player, video player, digital camera), or any other suitable device that uses memory. Memory device 100 provides memory for host 92. In one embodiment, memory device 100 includes a phase change memory device or other suitable resistive or resistivity changing material memory device.

Figure 2:
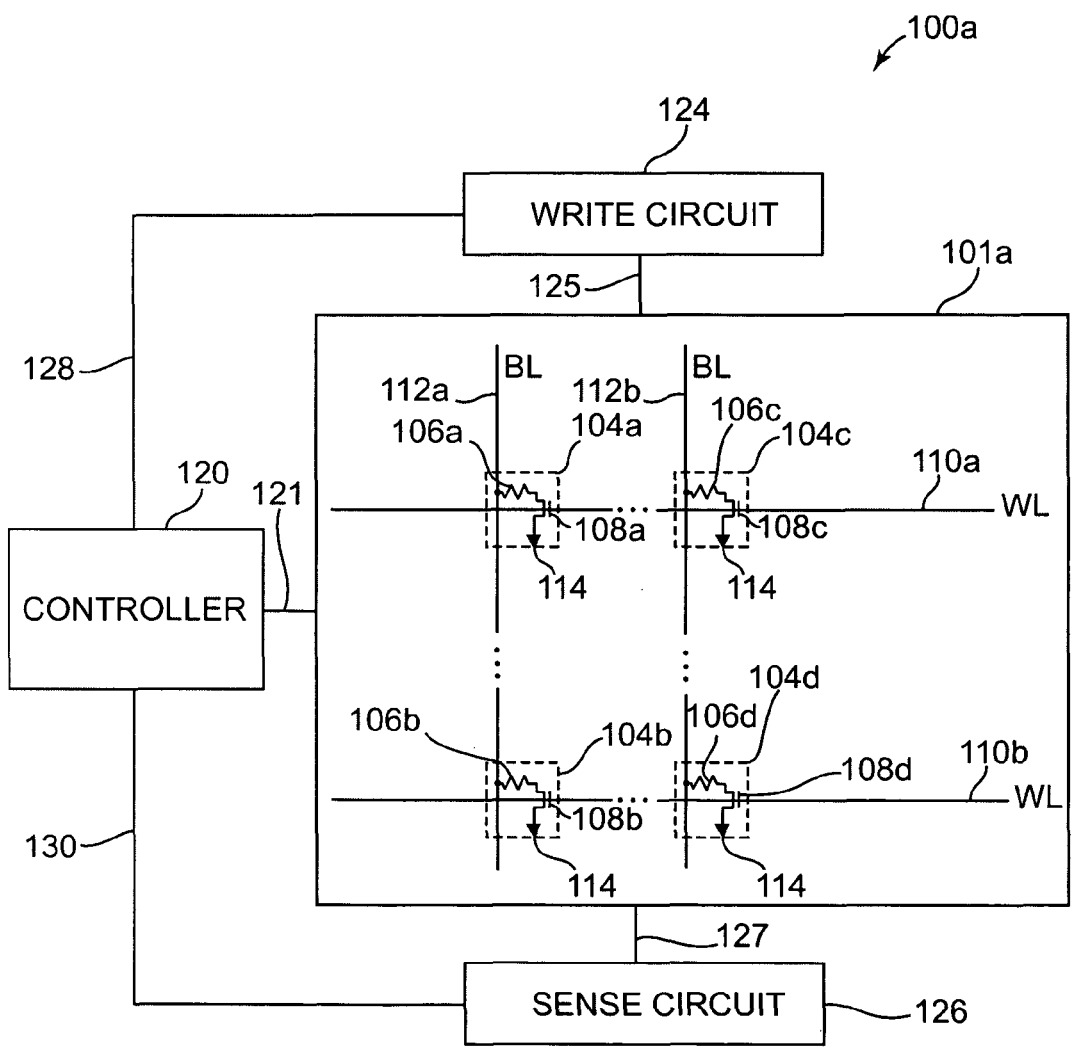
FIG. 2 is a diagram illustrating one embodiment of a memory device.

FIG. 2 is a diagram illustrating one embodiment of a memory device 100a. In one embodiment, memory device 100a provides memory device 100 previously described and illustrated with reference to FIG. 1. In one embodiment, memory device 100a is an integrated circuit or part of an integrated circuit. Memory device 100a includes a write circuit 124, a controller 120, a memory array 101a, and a sense circuit 126. Memory array 101a includes a plurality of phase change memory cells 104a-104d (collectively referred to as phase change memory cells 104), a plurality of bit lines (BLs) 112a-112b (collectively referred to as bit lines 112), and a plurality of word lines (WLs) 110a-110b (collectively referred to as word lines 110).

In one embodiment, memory array 101a or a portion of memory array 101a is configured to store error tolerable data. The width of the set pulses used to program phase change memory cells 104 to the crystalline state is reduced such that a predetermined percentage of memory cells 104 fail. By allowing a predetermined percentage of memory cells 104 to fail, the set pulse width can be reduced, thus increasing the overall speed of memory device 100a. In one embodiment, an error correction code circuit is used to correct data read from failed memory cells.

As used herein, the term "electrically coupled" is not meant to mean that the elements must be directly coupled together and intervening elements may be provided between the "electrically coupled" elements.

Memory array 101a is electrically coupled to write circuit 124 through signal path 125, to controller 120 through signal path 121, and to sense circuit 126 through signal path 127. Controller 120 is electrically coupled to write circuit 124 through signal path 128 and to sense circuit 126 through signal path 130. Each phase change memory cell 104 is electrically coupled to a word line 110, a bit line 112, and a common or ground 114. Phase change memory cell 104a is electrically coupled to bit line 112a, word line 110a, and common or ground 114, and phase change memory cell 104b is electrically coupled to bit line 112a, word line 110b, and common or ground 114. Phase change memory cell 104c is electrically coupled to bit line 112b, word line 110a, and common or ground 114, and phase change memory cell 104d is electrically coupled to bit line 112b, word line 110b, and common or ground 114.

Each phase change memory cell 104 includes a phase change element 106 and a transistor 108. While transistor 108 is a field-effect transistor (FET) in the illustrated embodiment, in other embodiments, transistor 108 can be another suitable device such as a bipolar transistor or a 3D transistor structure. In other embodiments, a diode or diode-like structure is used in place of transistor 108. In this case, a diode and phase change element 106 is coupled in series between each cross point of word lines 110 and bit lines 112.

Phase change memory cell 104a includes phase change element 106a and transistor 108a. One side of phase change element 106a is electrically coupled to bit line 112a, and the other side of phase change element 106a is electrically coupled to one side of the source-drain path of transistor 108a. The other side of the source-drain path of transistor 108a is electrically coupled to common or ground 114. The gate of transistor 108a is electrically coupled to word line 110a.

Phase change memory cell 104b includes phase change element 106b and transistor 108b. One side of phase change element 106b is electrically coupled to bit line 112a, and the other side of phase change element 106b is electrically coupled to one side of the source-drain path of transistor 108b. The other side of the source-drain path of transistor 108b is electrically coupled to common or ground 114. The gate of transistor 108b is electrically coupled to word line 110b.

Phase change memory cell 104c includes phase change element 106c and transistor 108c. One side of phase change element 106c is electrically coupled to bit line 112b and the other side of phase change element 106c is electrically coupled to one side of the source-drain path of transistor 108c. The other side of the source-drain path of transistor 108c is electrically coupled to common or ground 114. The gate of transistor 108c is electrically coupled to word line 110a.

Phase change memory cell 104d includes phase change element 106d and transistor 108d. One side of phase change element 106d is electrically coupled to bit line 112b and the other side of phase change element 106d is electrically coupled to one side of the source-drain path of transistor 108d. The other side of the source-drain path of transistor 108d is electrically coupled to common or ground 114. The gate of transistor 108d is electrically coupled to word line 110b.

In another embodiment, each phase change element 106 is electrically coupled to a common or ground 114 and each transistor 108 is electrically coupled to a bit line 112. For example, for phase change memory cell 104a, one side of phase change element 106a is electrically coupled to common or ground 114. The other side of phase change element 106a is electrically coupled to one side of the source-drain path of transistor 108a. The other side of the source-drain path of transistor 108a is electrically coupled to bit line 112a.

In one embodiment, each phase change element 106 includes a phase change material that may be made up of a variety of materials. Generally, chalcogenide alloys that contain one or more elements from group VI of the periodic table are useful as such materials. In one embodiment, the phase change material of phase change element 106 is made up of a chalcogenide compound material, such as GeSbTe, SbTe, GeTe, or AgInSbTe. In another embodiment, the phase change material is chalcogen free, such as GeSb, GaSb, InSb, or GeGaInSb. In other embodiments, the phase change material is made up of any suitable material including one or more of the elements Ge, Sb, Te, Ga, As, In, Se, and S.

Each phase change element 106 may be changed from an amorphous state to a crystalline state or from a crystalline state to an amorphous state under the influence of temperature change. The amount of crystalline material coexisting with amorphous material in the phase change material of one of the phase change elements 106a-106d thereby defines two or more states for storing data within memory device 100a. In the amorphous state, a phase change material exhibits significantly higher resistivity than in the crystalline state. Therefore, the two or more states of phase change elements 106a-106d differ in their electrical resistivity. In one embodiment, the two or more states are two states and a binary system is used, wherein the two states are assigned bit values of "0" and "1". In another embodiment, the two or more states are three states and a ternary system is used, wherein the three states are assigned bit values of "0", "1", and "2". In another embodiment, the two or more states are four states that can be assigned multi-bit values, such as "00", "01", "10", and "11".

In other embodiments, the two or more states can be any suitable number of states in the phase change material of a phase change element.

Controller 120 includes a microprocessor, microcontroller, or other suitable logic circuitry for controlling the operation of memory device 100a. Controller 120 controls read and write operations of memory device 100a including the application of control and data signals to memory array 101a through write circuit 124 and sense circuit 126. In one embodiment, write circuit 124 provides voltage pulses through signal path 125 and bit lines 112 to memory cells 104 to program the memory cells. In other embodiments, write circuit 124 provides current pulses through signal path 125 and bit lines 112 to memory cells 104 to program the memory cells.

Sense circuit 126 reads each of the two or more states of memory cells 104 through bit lines 112 and signal path 127. In one embodiment, to read the resistance of one of the memory cells 104, sense circuit 126 provides current that flows through one of the memory cells 104. Sense circuit 126 then reads the voltage across that one of the memory cells 104. In another embodiment, sense circuit 126 provides voltage across one of the memory cells 104 and reads the current that flows through that one of the memory cells 104. In another embodiment, write circuit 124 provides voltage across one of the memory cells 104 and sense circuit 126 reads the current that flows through that one of the memory cells 104. In another embodiment, write circuit 124 provides current that flows through one of the memory cells 104 and sense circuit 126 reads the voltage across that one of the memory cells 104.

During a set operation of phase change memory cell 104a, word line 110a is selected to activate transistor 108a. With word line 110a selected, one or more set current or voltage pulses are selectively enabled by write circuit 124 and sent through bit line 112a to phase change element 106a. The set current or voltage pulses heat phase change element 106a above its crystallization temperature (but usually below its melting temperature). In this way, phase change element 106a reaches the crystalline state or a partially crystalline and partially amorphous state during this set operation.

During a reset operation of phase change memory cell 104a, word line 110a is selected to activate transistor 108a. With word line 110a selected, a reset current or voltage pulse is selectively enabled by write circuit 124 and sent through bit line 112a to phase change element 106a. The reset current or voltage quickly heats phase change element 106a above its melting temperature. After the current or voltage pulse is turned off, phase change element 106a quickly quench cools into the amorphous state or a partially amorphous and partially crystalline state. Phase change memory cells 104b-104d and other phase change memory cells 104 in memory array 101a are set and reset similarly to phase change memory cell 104a using similar current or voltage pulses.

In operation of one embodiment, the set pulse width for setting a memory cell 104 of memory array 101a to the crystalline state is based on a predetermined error percentage for memory array 101a. In one embodiment, where the set pulse is a single pulse, the set pulse width is defined as the width of the single pulse. In another embodiment, where the set pulse includes a plurality of individual pulses, the set pulse width is defined as the total or sum of the widths of the individual pulses. The predetermined error percentage is based on the error tolerance for the application data stored in memory array 101a. The greater the error tolerance for the application data, the shorter the set pulse width may be, thus increasing the overall speed of memory device 100a.

For example, a complementary metal oxide semiconductor (CMOS) camera raw data buffer is an error tolerable application. If a 0.01% error percentage is selected, the speed of the CMOS camera raw data buffer can be increased by up to a factor of five in one embodiment without having a significant negative impact on the quality of the image data. In other applications, a 1% error percentage is selected such that the speed of memory device 100a can be increased by up to a factor of ten compared to an error free memory device.

Figure 3:
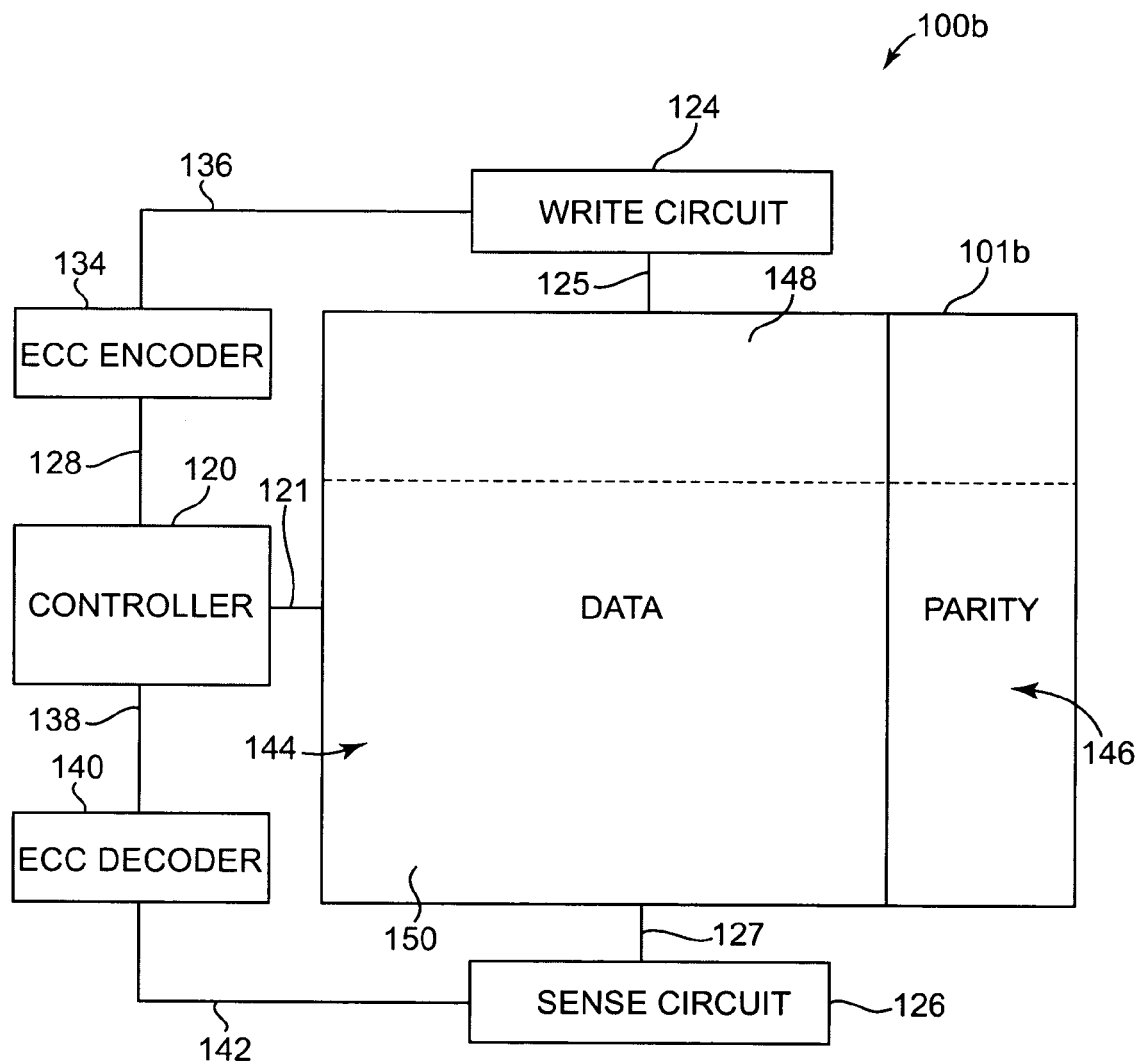
FIG. 3 is a diagram illustrating another embodiment of a memory device.

FIG. 3 is a diagram illustrating another embodiment of a memory device 100b. In one embodiment, memory device 100b provides memory device 100 previously described and illustrated with reference to FIG. 1. In one embodiment, memory device 100b is an integrated circuit or part of an integrated circuit. Memory device 100b is similar to memory device 100a previously described and illustrated with reference to FIG. 2, except that memory device 100b includes error correction code (ECC) encoder 134 and ECC decoder 140. In addition, memory array 101a has been replaced with memory array 101b.

Controller 120 is electrically coupled to ECC encoder 134 through signal path 132 and to ECC decoder 140 through signal path 138. ECC encoder 134 is electrically coupled to write circuit 124 through signal path 136. ECC decoder 140 is electrically coupled to sense circuit 126 through signal path 142.

Memory array 101b includes a plurality of phase change memory cells, such as phase change memory cells 104 previously described and illustrated with reference to FIG. 2. The phase change memory cells are divided into memory cells used to store data as indicated at 144 and memory cells used to store parity information for the data as indicated at 146. In one embodiment, memory array 101b is also divided into a first portion 148 used to store error tolerable data and a second portion 150 used to store error free data.

ECC encoder 134 receives data to write to memory array 101b from controller 120 through signal path 132. ECC encoder 134 generates parity information for the received data and passes the data and the parity information to write circuit 124 through signal path 136. In one embodiment, ECC encoder 134 using a Hamming code to generate the parity information. In other embodiments, ECC encoder 134 uses another suitable algorithm to generate the parity information. Write circuit 124 writes the data to data portion 144 of memory array 101b and writes the parity information to parity information portion 146 of memory array 101b.

ECC decoder 140 receives data and the parity information for the data read from memory array 101b from sense circuit 126 through signal path 142. ECC decoder 140 decodes the parity information to detect and correct bit failures within the data. In one embodiment, ECC decoder 140 detects and corrects single bit failures within the data. ECC decoder 140 passes the corrected data to controller 120 through signal path 138.

In operation of one embodiment where ECC is enabled, the set pulse width for setting a memory cell within memory array 101b to the crystalline state is based on a predetermined error percentage. ECC encoder 134 generates parity information and ECC decoder 140 decodes the parity information to correct the data errors generated due to the shorter set pulse width. Therefore, the speed of memory device 100b is increased while still providing error free data to host 92 (FIG. 1).

In operation of another embodiment where ECC is disabled, a first set pulse width for setting a memory cell within first portion 148 of memory array 101b to the crystalline state is based on a predetermined error percentage for the data stored in first portion 148. A second set pulse width for setting a memory cell within second portion 150 of memory array 101b to the crystalline state is selected such that second portion 150 stores error free data. The second set pulse width is greater than the first set pulse width.

Figure 4:
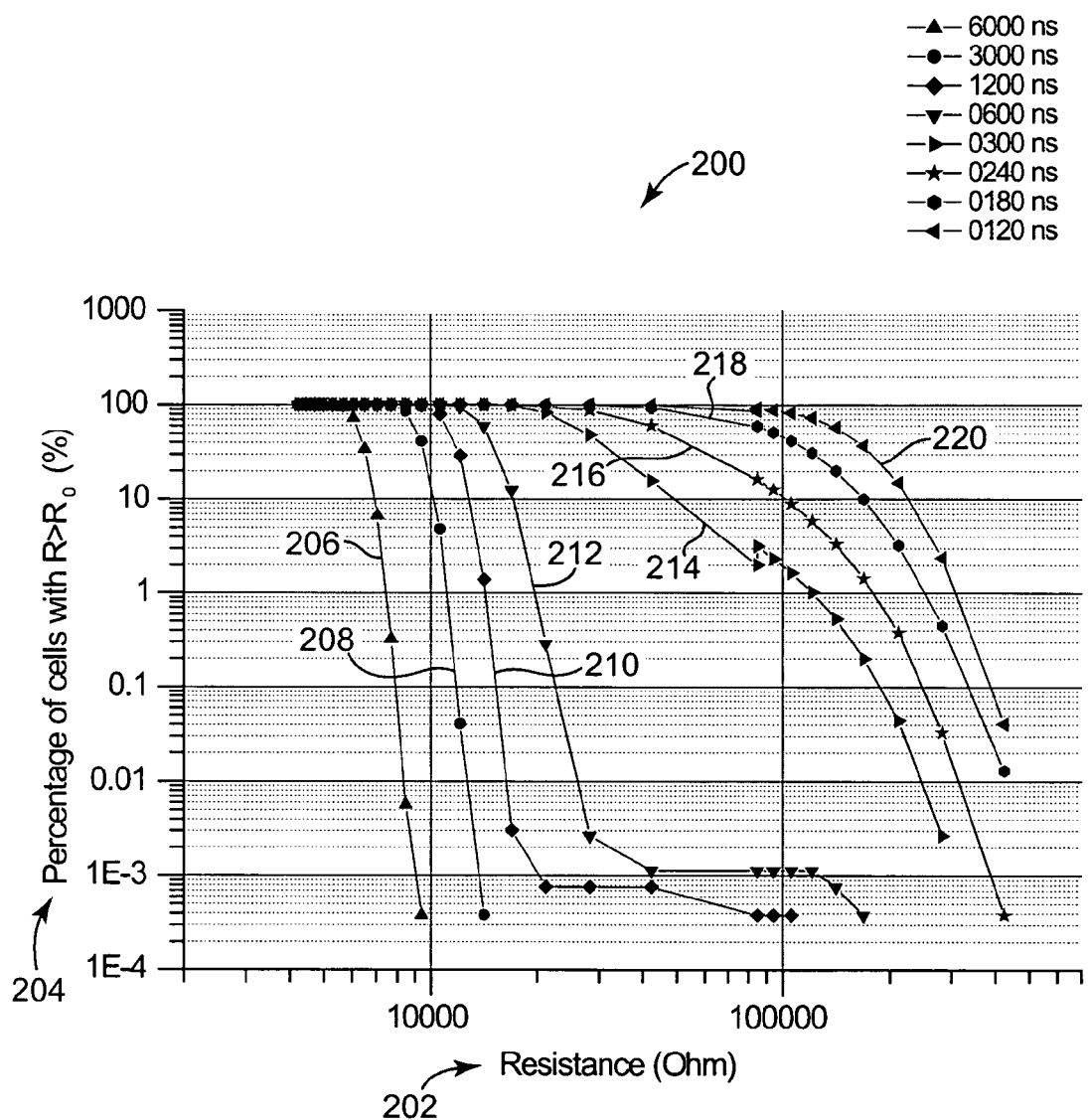
FIG. 4 is a graph illustrating one embodiment of the resistance of phase change memory cells programmed using different set pulse widths.

FIG. 4 is a graph 200 illustrating one embodiment of the resistance of phase change memory cells programmed using different set pulse widths. Graph 200 includes resistance in ohms on x-axis 202 and the percentage of memory cells having a resistance (R) greater than a reference resistance ($R_O$) on y-axis 204. In this embodiment, the reference resistance is 30 kOhm such that a resistance less than 30 kOhm is considered the crystalline state and a resistance greater than 30 kOhm is considered the amorphous state for a phase change memory cell.

Curve 206 illustrates results for a 6000 ns set pulse width. Curve 208 illustrates results for a 3000 ns set pulse width. Curve 210 illustrates results for a 1200 ns set pulse width. Curve 212 illustrates results for a 600 ns set pulse width. Curve 214 illustrates results for a 300 ns set pulse width. Curve 216 illustrates results for a 240 ns set pulse width. Curve 218 illustrates results for a 180 ns set pulse width, and curve 220 illustrates results for a 120 ns set pulse width.

As indicated by curve 208, for an error free memory, the set pulse width is at least 3000 ns. As indicated by curve 212, for an error percentage of 0.01%, the set pulse width is 600 ns. Therefore, for a 0.01% error percentage, the speed of the memory is increased by a factor of five compared to the error free memory. As indicated by curve 214, for an error percentage of 1%, the set pulse width is 300 ns. Therefore, for a 1% error percentage, the speed of the memory is increased by a factor of ten compared to the error free memory.

Embodiments provide a memory device where a set pulse width is based on a predetermined error percentage for data stored in the memory device. For error tolerant applications, the set pulse width is reduced to increase the overall speed of the memory device. The reduced set pulse width is used to program all memory cells within an array of the memory device or a portion of the array of the memory device. In one embodiment, errors generated in response to the reduced set pulse width are detected and corrected using an error correction code.

While the specific embodiments described herein substantially focused on using phase change memory elements, the embodiments can be applied to any suitable type of resistance or resistivity changing memory elements.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. An integrated circuit comprising:
an array of resistance changing memory cells, the array including a first portion; and
a circuit configured to apply a set pulse having a first pulse width to a first memory cell in the first portion to set the first memory cell, the first pulse width based on a predetermined error percentage for the first portion.

2. The integrated circuit of claim 1, wherein the first portion is configured to store error tolerable data.

3. The integrated circuit of claim 2, wherein the array includes a second portion configured to store error free data; and
wherein the write circuit is configured to apply a set pulse having a second pulse width greater than the first pulse width to a second memory cell in the second portion to set the second memory cell.

4. The integrated circuit of claim 1, further comprising:
an error correction code circuit configured to correct errors in data read from the array.

5. The integrated circuit of claim 1, wherein the first portion includes the whole array.

6. The integrated circuit of claim 1, wherein the set pulse comprises a plurality of individual pulses, and wherein the first pulse width includes a total of each width of the individual pulses.

7. The integrated circuit of claim 1, wherein the predetermined error percentage is greater than 0% and less than or equal to 1%.

8. The integrated circuit of claim 1, wherein the predetermined error percentage is greater than 0% and less than or equal to 0.01%.

9. The integrated circuit of claim 1, wherein the array comprises an array of phase change memory cells.

10. A system comprising:
a host; and
a memory device communicatively coupled to the host, the memory device comprising:
an array of resistance changing memory cells, the array including a first portion configured to store error tolerable data; and
a write circuit configured to apply a first set pulse having a first pulse width to a first memory cell in the first portion to set the first memory cell, the first pulse width based on a predetermined error percentage for the first portion.

11. The system of claim 10, wherein the array includes a second portion configured to store error free data; and
wherein the write circuit is configured to apply a second set pulse having a second pulse width greater than the first pulse width to a second memory cell in the second portion to set the second memory cell.

12. The system of claim 10, wherein the memory device further comprises:
an error correction code circuit configured to correct errors in data read from the array.

13. The system of claim 10, wherein the memory device further comprises:
a sense circuit configured to read data from the array; and
a controller configured to control the write circuit and the sense circuit.

14. The system of claim 10, wherein the array comprises an array of phase change memory cells.

15. The system of claim 10, wherein the first portion includes the whole array.

16. The system of claim 10, wherein the first set pulse comprises a plurality of individual pulses, and wherein the first pulse width includes a total of each width of the individual pulses.

17. A method for programming a memory cell, the method comprising:
providing an array of resistance changing memory cells, the array including a first portion configured to store error tolerable data; and
applying a first set pulse having a first pulse width to a first memory cell in the first portion to set the first memory cell, the first pulse width based on a predetermined error percentage for the first portion.

18. The method of claim 17, wherein providing the array comprises providing the array including a second portion configured to store error free data; and
applying a second set pulse having a second pulse width greater than the first pulse width to a second memory cell in the second portion to set the second memory cell.

19. The method of claim 18, wherein applying the second set pulse comprises applying the second set pulse having a second pulse width at least two times greater than the first pulse width.

20. The method of claim 18, wherein applying the second set pulse comprises applying the second set pulse having a second pulse width at least five times greater than the first pulse width.

21. The method of claim 17, wherein applying the first set pulse comprises applying the first set pulse having a first pulse width based on a predetermined error percentage greater than 0% and less than or equal to 1%.

22. The method of claim 17, wherein applying the first set pulse comprises applying the first set pulse having a first pulse width based on a predetermined error percentage greater than 0% and less than or equal to 0.01%.

23. The method of claim 17, further comprising:
reading data from the array of memory cells; and
correcting errors in the read data.

24. The method of claim 17, wherein providing the array comprises providing an array of phase change memory cells.

* * * * *